United States Patent [19]
Ohta

[11] Patent Number: 4,988,188
[45] Date of Patent: Jan. 29, 1991

[54] ILLUMINATION DEVICE

[75] Inventor: Masakatsu Ohta, Kawasaki, Japan

[73] Assignee: Canon Kabushiki Kaisha, Tokyo, Japan

[21] Appl. No.: 238,592

[22] Filed: Aug. 31, 1988

[30] Foreign Application Priority Data

Aug. 31, 1987 [JP] Japan .................. 62-218789

[51] Int. Cl.$^5$ .......................................... G03B 27/32
[52] U.S. Cl. ................................ 353/122; 353/101; 350/167; 355/67; 355/53; 362/268
[58] Field of Search ............... 353/101, 122; 250/201, 250/204, 205; 350/167, 475; 355/67, 68, 71, 53, 46; 362/268

[56] References Cited

U.S. PATENT DOCUMENTS

| | | | |
|---|---|---|---|
| 4,497,013 | 1/1985 | Ohta | 362/32 |
| 4,598,197 | 7/1986 | Morita et al. | 355/68 |
| 4,682,885 | 7/1987 | Torigoe | 362/268 |
| 4,733,944 | 3/1988 | Fahlen et al. | 350/167 |
| 4,769,750 | 9/1988 | Matsumoto et al. | 350/167 |
| 4,789,222 | 12/1988 | Ota et al. | 355/46 |
| 4,851,882 | 7/1989 | Takahashi et al. | 355/46 |

FOREIGN PATENT DOCUMENTS 61-267722  11/1986  Japan .
62-52929   3/1987   Japan .
63-12135   7/1988   Japan .

Primary Examiner—William A. Cuchlinski, Jr.
Assistant Examiner—Patrick R. Scanlon
Attorney, Agent, or Firm—Fitzpatrick, Cella, Harper & Scinto

[57] ABSTRACT

An illumination device includes a light source; a secondary light source forming system for forming predetermined secondary light sources by use of light from the light source, the secondary light source forming system including a plurality of lens array units disposed in the direction of an optical axis and each having a plurality of lens elements distributed in a plane perpendicular to the optical axis; an optical system for directing light from the secondary light sources to a surface to be illuminated; and an actuating device for displacing at least one lens array unit in the direction of the optical axis to adjust the illuminance distribution on the surface being illuminated, while maintaining a substantially constant range of illumination on the surface being illuminated.

13 Claims, 5 Drawing Sheets

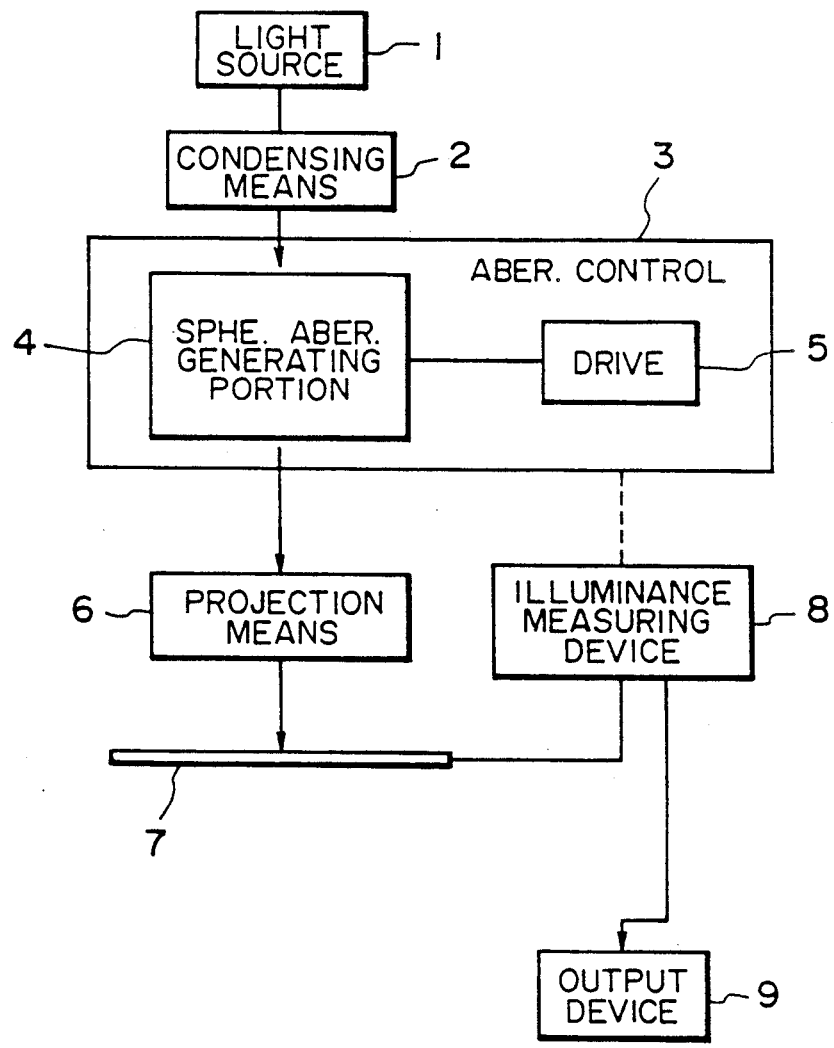
FIG. IA

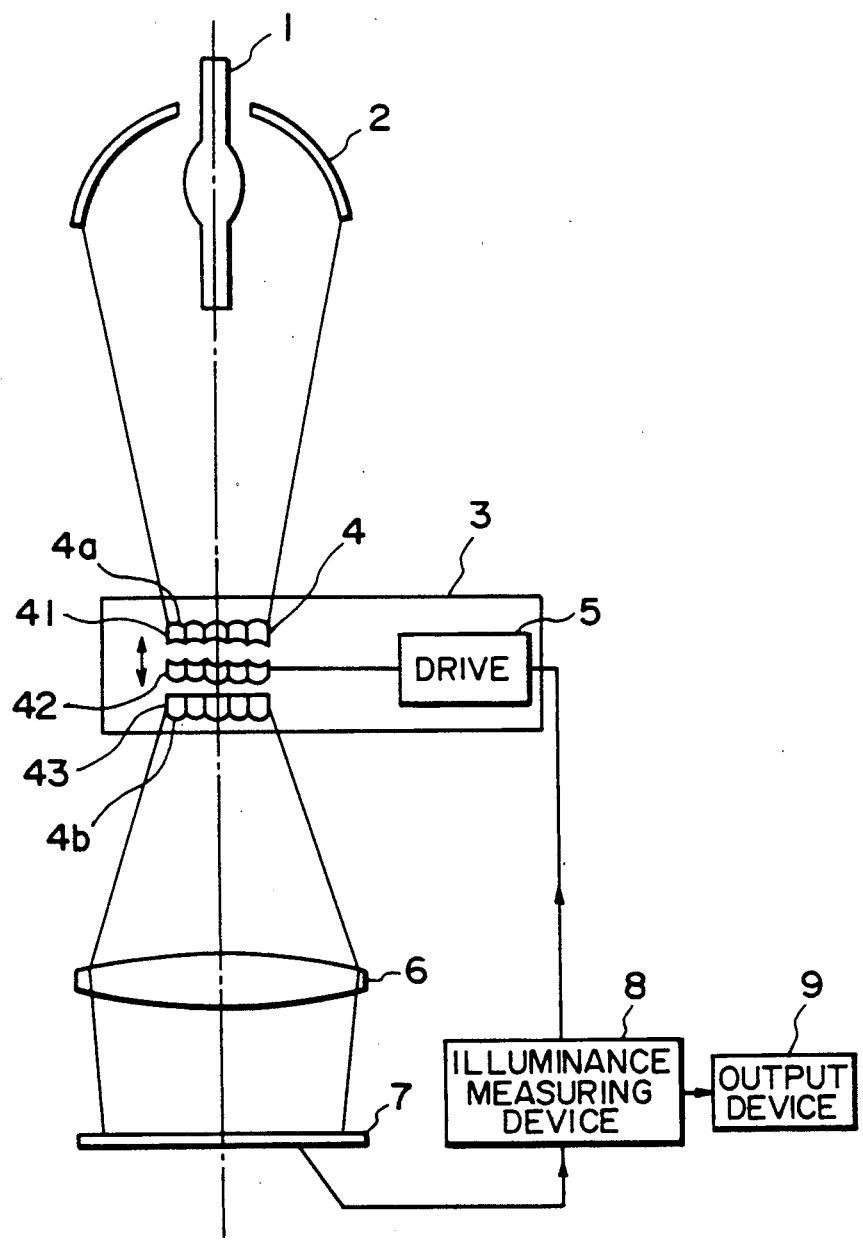

ILLUMINATION DEVICE

FIELD OF THE INVENTION AND RELATED ART

This invention relates to an illumination device and, more particularly, to an illumination device for adjusting or controlling an illuminance distribution on a surface, such as a surface of a mask, for example, to be illuminated.

When, in a semiconductor device manufacturing exposure apparatus, there is a non-uniform the illuminance distribution on the surface of a mask (which is a surface to be illuminated), there occurs unevenness in the linewidth of a pattern transferred onto the surface of a wafer. Because of the recent demand for the manufacture of extraordinarily fine patterns (IC patterns), the precision of uniformness in the linewidth should be increased. For example, the precision should be not greater than ±1% which is remarkably lower than the traditionally required precision (±3%).

Also, in accordance with the requirements of miniaturization, higher precision is required also with regard to the illuminance distribution on the surface of a mask. Namely, highly uniform distribution or exactly desired distribution should be provided.

In order to meet these requirements, there have been proposed illumination devices for adjusting the illuminance distribution on the surface to be illuminated, such as a mask surface, as disclosed in Japanese Laid-Open Patent Applications, Laid-Open Nos. Sho61-267722 and Sho62-52929, both filed in Japan in the name of the assignee of the subject application.

According to the proposed illumination devices, it is possible to provide a quite uniform or exactly desired illuminance distribution on the surface being illuminated.

SUMMARY OF THE INVENTION

It is an object of the present invention to provide an improved illumination device for adjusting or controlling the illuminance distribution.

Briefly, in accordance with one aspect of the present invention, there is provided an illumination device which includes a light source; secondary light source forming means for forming predetermined secondary light sources by use of light from the light source, the secondary light source forming means including a plurality of lens array units disposed in the direction of an optical axis and each having a plurality of lens elements distributed in a plane perpendicular to the optical axis; an optical system for directing light from the secondary light sources to a surface to be illuminated; and actuating means for displacing at least one lens array unit in the direction of the optical axis to adjust the illuminance distribution on the surface being illuminated, while maintaining a substantially constant range of illumination on the surface being illuminated. With this arrangement, the light can be efficiently directed to the surface to be illuminated, and the surface can be illuminated with a desired illuminance distribution.

Preferably, the plural lens array units comprise, in an order from the light source side, a first lens array unit having a positive refracting power, a second lens array unit having a negative refracting power and a third lens array unit having a positive refracting power. For example, the second lens array unit is displaced to change spherical aberration to be caused by the secondary light source forming means and, by doing so, the illuminance distribution on the surface being illuminated can be adjusted.

Significant advantageous effects are attainable when the illumination device of the present invention is incorporated into an exposure apparatus for transferring a pattern of a mask onto a wafer. Namely, when this is done, it is possible to remarkably improve the pattern transfer characteristics of the exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1A is a schematic and diagrammatic view of an illumination device according to one embodiment of the present invention.

FIG. 1B is a schematic and diagrammatic view showing details of the optical arrangement of a optical system included in the embodiment of FIG. 1A.

DESCRIPTION OF THE PREFERRED EMBODIMENTS

Figure 2A:
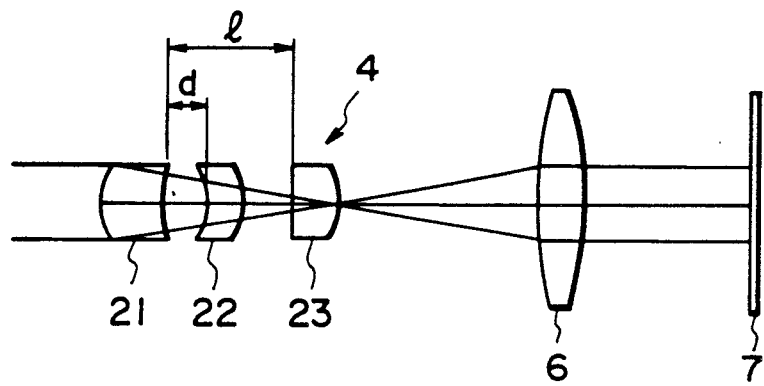
FIGS. 2A and 2B are schematic views, respectively, for explicating the manner of adjustment of the illuminance distribution.

FIG. 1A is a schematic block diagram of one embodiment of the present invention, and FIG. 1B is a schematic view showing a specific example of an optical system usable in the FIG. 1A embodiment. In these Figures, denoted at 1 is a light source which comprises, for example, a super high pressure Hg lamp. Denoted at 2 is a condensing means which comprises an elliptical mirror, for example. The light source 1 is disposed in the neighborhood of a first focal point of the elliptical mirror 2. Denoted at 3 is an aberration controlling means which includes an aberration producing portion 4 and an actuator (drive) 5. The aberration producing portion 4 functions to produce spherical aberration by use of an optical system that constitutes the aberration controlling means 3, and also functions to emit a light. The actuating portion 5 functions to displace one or more members, such as lenses, which are constituent elements of the spherical aberration producing portion 4, to thereby change the spherical aberration caused by the aberration producing portion 4.

In the present embodiment, the spherical aberration producing portion 4 comprises an optical integrator which includes three lens array units 4-1, 4-2 and 4-3 each having a plurality of minute lenses arrayed one-dimensionally or two-dimensionally in a plane orthogonal to the optical axis of the illumination device. The optical integrator 4 has a light entrance surface 4a which is disposed in the neighborhood of a second focal point of the elliptical mirror 2. Also, the optical integrator 4 has a light exit surface 4b which provides a secondary light source surface that comprises a number of secondary light sources. The light exit surface 4b of the optical integrator is located at a position at which parallel light, having been projected on the light entrance surface 4a is converges.

Denoted at 6 is a light projection means which comprises a condenser lens, for example. The projection means 6 functions to illuminate, by use of a multi-beam light from the light exit surface 4b of the optical integrator 4, a surface 7 to be illuminated, with respect to which surface the surface of a mask or reticle should be positioned. Denoted at 8 is an illuminance measuring device having a sensor device (not shown) such as a two-dimensional image pickup device, a movable one-dimensional sensor array or a movable photodetector, for measuring the illuminance distribution on the surface 7 being illuminated, on the basis of output signals of the sensor means. The measured value or an instruction signal corresponding to that value is supplied to the actuating portion 5. Denoted at 9 is an output device for outputting, as required, the measured value supplied from the illuminance measuring device 8.

In the present embodiment, the light from the light source 1 is directed and projected, by use of the elliptical mirror 2, to and on the optical integrator 4 which is positioned so that its light entrance surface 4a is positioned in the neighborhood of the second focal point of the elliptical mirror 2. The light fluxes emanating from the minute lenses (secondary light sources) constituting the light emitting surface 4b of the optical integrator 4 are projected and superposed upon one another on the surface 7 by means of the condensers lens 6 which is fixed at a predetermined position.

Also, in the present embodiment, the surface 7 to be illuminated is positioned in a focal plane, on an image side, of the condenser lens 6. Further, the surface 7 and the light entrance surface 4a of the optical integrator 4 are set to be held in an optically conjugate relationship.

The light emitting surface 4b of the optical integrator 4, namely, the secondary light source surface, is positioned in another focal plane of the condenser lens 6 on the object side (light source side). Thus, for example, the light flux emanating from the center of the secondary light source surface (i.e., the point of intersection of the secondary light source surface with the optical axis) is transformed by the condenser lens 6 into parallel light consisting of light rays advancing in parallel to the optical axis.

In the present embodiment, the optical integrator 4 is provided by three lens array units 4-1, 4-2 and 4-3, as illustrated in FIG. 1B, having, in the order from the light source 1 side, positive, negative and positive refracting powers. Of these lens array units, the lens array units 4-2 is made displaceable by the actuating portion 5 in the direction of the optical axis as shown by a double-headed arrow in FIG. 1B, to thereby change the spherical aberration, to be caused by the optical integrator 4, with respect to the light incident on the optical integrator 4, while substantially fixedly retaining the position of the secondary light source surface. By this structure, the conditions concerning the incidence of each light beam from the optical integrator 4 upon the condenser lens 6 are changed to thereby adjust the illuminance distribution to be defined on the surface 7. Also, by such adjustment, it becomes possible to make the illuminance distribution uniform. For example, any change in the illuminance distribution on the surface 7 caused by the movement of the lens unit 4-2 may be detected on the basis of the output signals from the illuminance measuring device 8 and the movement of the lens array unit 4-2 may be controlled by the actuating portion 5 so as to make the illuminance distribution uniform.

Next, a description will be provided of the principle of changing the illuminance distribution on the surface 7 by displacing the lens array unit 4-2.

Figure 2B:
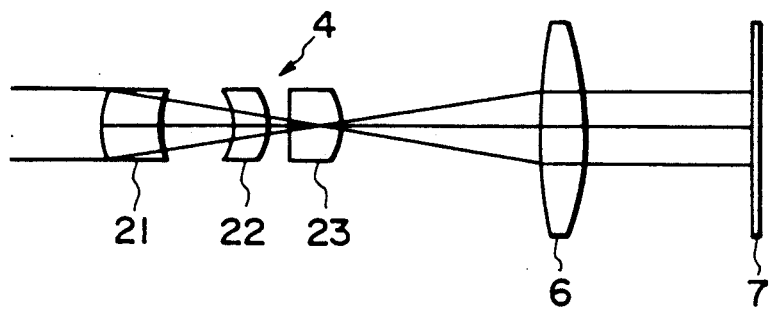

FIGS. 2A and 2B are schematic views, respectively, each showing one set of lens elements each being a constituent element of a corresponding one of the lens array units 4-1, 4-2 and 4-3 of the optical integrator 4, these lens elements in the one set being arrayed in a direction parallel to the optical axis. The manner of adjusting the illuminance distribution will be explained with reference to these figures.

In FIGS. 2A and 2B, reference numerals 21, 22 and 23 denote minute lenses which are constituent members of the lens array units 4-1, 4-2 and 4-3 of the optical integrator 4, respectively. As illustrated in these figures, the lens 21 comprises a positive lens; the lens 22 comprises a negative meniscus lens having a concave surface facing to the light source side; and the lens 23 comprises a positive lens. Denoted at d is the spacing between the lenses 21 and 22, and denoted at 1 is the spacing between the lenses 21 and 23.

The situation shown in FIG. 2B is such that, in the arrangement shown in FIG. 2A, the lens 22 has been displaced to the condenser lens 6 side so as to change the spherical aberration to be produced by the illustrated optical arrangement.

Also, in the present embodiment, in order to assure that the refracting power (focal length) of the optical integrator is always maintained substantially constant, the minute lens 21 is displaced in the direction of the optical axis by a predetermined amount, with the displacement of the minute lens 22 in the direction of the optical axis and, also, in association with the direction and amount of the displacement of the minute lens 22. By doing so, it becomes possible to change the illuminance distribution while maintaining a substantially constant range of illumination on the surface 7. In the illustrated example, the lens 23 is held fixed.

By moving the lens 22 toward the condenser lens 6 side, from the state shown in FIG. 2A to the state shown in FIG. 2B, the positional relationship among the lenses 21-23 is changed to thereby change the height and angle of incidence of light upon the lens 22. As a result of this, there occurs a change in the spherical aberration caused by the optical system that comprises the lenses 21-23.

More specifically, when parallel light is projected upon the optical integrator 4, parallel light is projected through the condenser lens 6 upon the surface 7, which is an optically conjugate plane with respect to the light entrance surface 4a, provided that no spherical aberration is caused by the optical integrator. Namely, the position of incidence of light upon the surface 7 is determined by the spherical aberration of the optical integrator 4. Therefore, by changing the spherical aberration to be caused by the optical integrator 4, it is possible to change the state of incidence of light upon the surface 7 and, as a result of which, to change the illuminance distribution on the surface 7.

As will be understood from the foregoing, in the present embodiment it is also possible to make uniform the illuminance distribution on the surface 7 by changing the spherical aberration to be caused by the optical integrator 4.

Figure 3A:
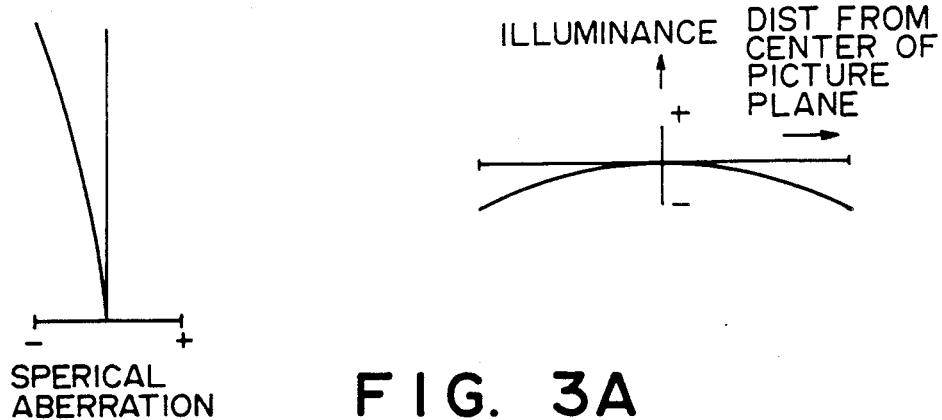
FIGS. 3A-3C each shows the relationship between the illuminance distribution and spherical aberration caused at a spherical aberration creating portion.
Figure 3B:
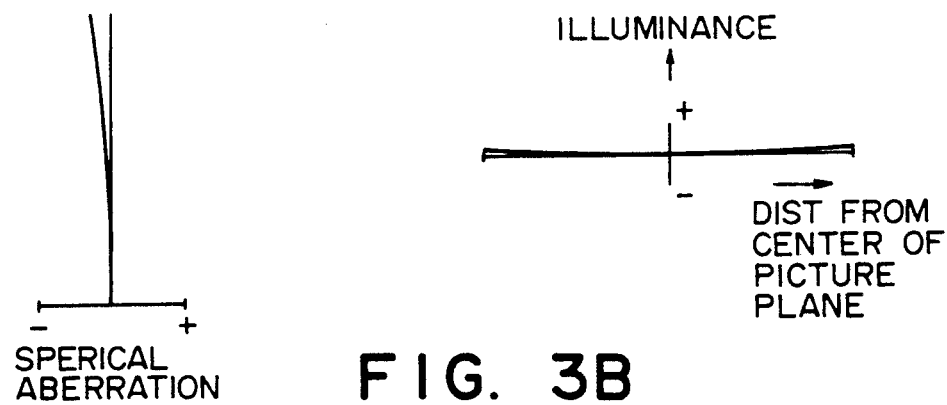
Figure 3C:
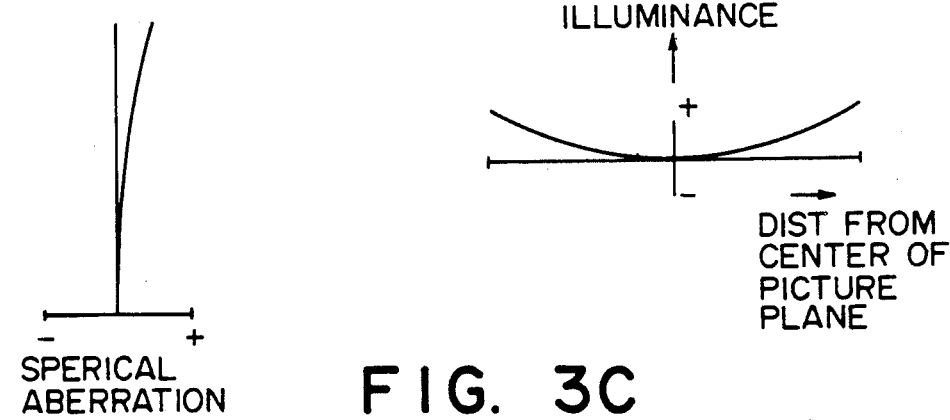

FIGS. 3A-3C are views explicating the relationship between the illuminance distribution on the surface 7 and the spherical aberration caused by the optical integrator 4, in the case where the lenses 21 and 22 are displaced as has been described with reference to FIGS. 2A and 2B. FIG. 3B corresponds to a case where the minute lens 22 is displaced by a suitable amount to produce a predetermined spherical aberration to thereby make the illuminance distribution substantially uniform. FIG. 3A corresponds to the case wherein, because of the large amount of movement of the minute lens 22, the correction of the spherical aberration is insufficient and, as a result the illuminance is too high, at the marginal regions of the surface 7. FIG. 3C corresponds to a case where, contrary to the FIG. 3A case, because of the small amount of movement of the minute lens 22, the correction of the spherical aberration is excessive, such that the illuminance distribution on the surface 7 is too high at the marginal regions.

Figure 4:
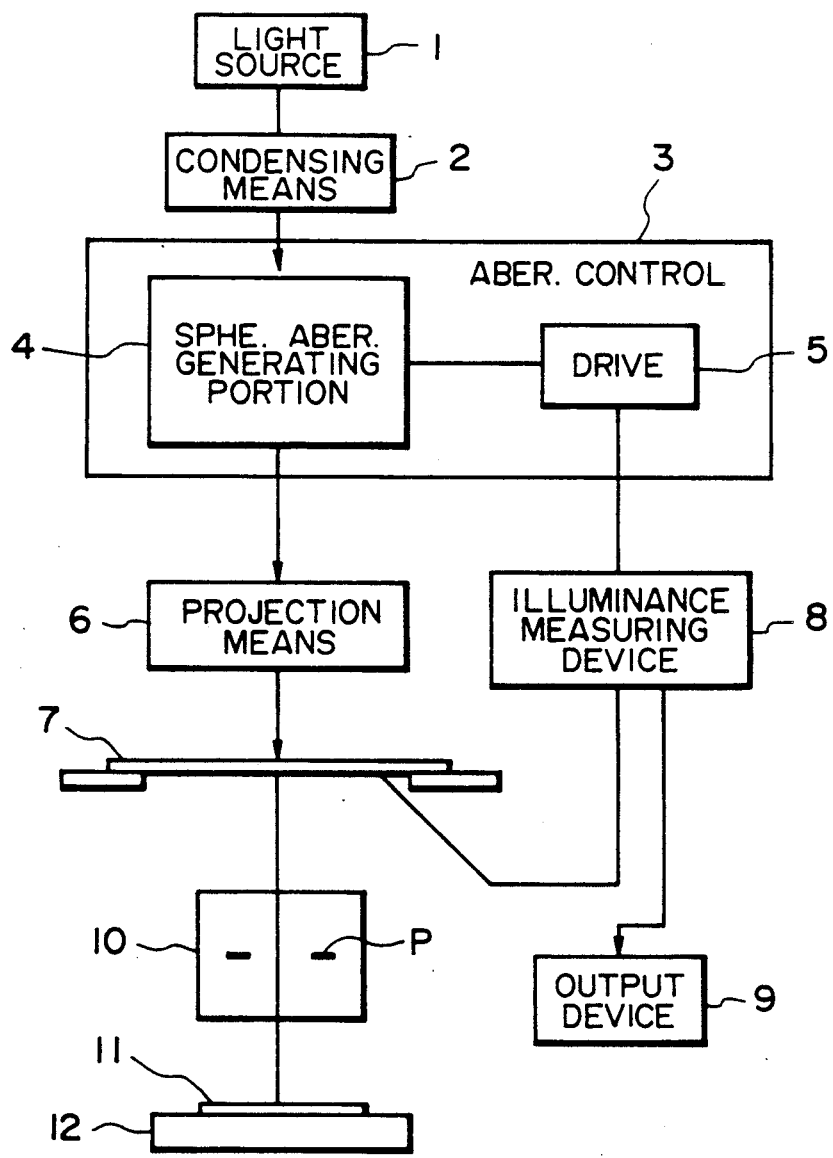
FIG. 4 is a schematic and diagrammatic view of an illumination device according to another embodiment of the present invention.

FIG. 4 is a schematic diagram showing another embodiment of the present invention. The illustrated embodiment is an example where an illumination device is incorporated into a projection exposure apparatus which is called a "stepper". The same reference numerals are assigned to those elements corresponding to or similar to the elements shown in FIG. 1B.

The present embodiment differs from the FIG. 1B embodiment in that a circuit pattern (IC pattern) formed on the surface of a reticle, disposed on the surface 7 to be illuminated, is projected through a reduction projection lens 10 upon the surface of a wafer 11 held on a wafer stage 12.

In the present embodiment, a secondary light source surface formed by an optical integrator which is a constituent element of a spherical aberration producing portion 4 is placed in an optically conjugate relationship with an entrance pupil of the projection lens system 10. This optically conjugate relationship is maintained irrespective of displacement of one or more lens units of the optical integrator made to change the spherical aberration. Further, the refracting power of the optical integrator is maintained substantially fixed, as in the foregoing embodiment. Therefore, the range of illumination does not change as a result of the adjustment of the illuminance distribution. Thus, the circuit pattern on the reticle surface can be illuminated correctly and efficiently and, therefore, the circuit pattern can be transferred onto the wafer correctly.

While the invention has been described with reference to the structures disclosed herein, it is not confined to the details set forth and this application is intended to cover such modifications or changes as may come within the purposes of the improvements or the scope of the following claims.

What is claimed is:

1. An illumination device, comprising:
    a light source;
    secondary light source forming means for forming predetermined secondary light sources by use of light from said light source, said secondary light source forming means including a plurality of lens array units arrayed in a direction of an optical axis, each lens array unit having a plurality of lens elements disposed along a plane orthogonal to the optical axis;
    an optical arrangement for directing light beams from said secondary light sources to a surface to be illuminated, and for superposing the light beams one upon another on the surface to be illuminated; and
    means for changing the positional relationship of said lens array units, in the direction of the optical axis, while maintaining a substantially constant refracting power of said secondary light source forming means, to thereby adjust the illuminance distribution on the surface to be illuminated.

2. A device according to claim 1, wherein said plural lens array units comprise, in an order from the light source side, a first lens array unit having a positive refracting power, a second lens array unit having a negative refracting power and a third lens array unit having a positive refracting power, and wherein said first and second lens array units are displaceable through said positional relationship changing means.

3. A device according to claim 2, wherein said third lens array unit is immovably fixed with respect to the direction of the optical axis.

4. A device according to claim 3, further comprising a condensing optical system for concentrating the light from said light source onto said first lens array unit.

5. An illumination device, comprising:
    a light source for providing light of a predetermined wavelength;
    an optical integrator having a predetermined refracting power and a predetermined spherical aberration with respect to said predetermined wavelength, for receiving the light from said light source and for providing a plurality of light beams;
    means for directing the light beams from said optical integrator to a surface to be illuminated so that the light beams are superposed upon one another on the surface to be illuminated; and
    adjusting means for adjusting said predetermined spherical aberration of said optical integrator while substantially maintaining said predetermined refracting power of said optical integrator, to change the illuminance distribution on the surface to be illuminated.

6. A device according to claim 5, wherein said optical integrator includes first and second movable lens array units disposed along an optical axis, each unit including a plurality of lens elements disposed along a plane perpendicular to the optical axis, and wherein said adjusting means includes an actuator for displacing said first and second lens array units to change the illuminance distribution on the surface to be illuminated.

7. A device according to claim 6, wherein the displacement of said first lens array unit by said actuator contributes to adjustment of said predetermined spherical aberration of said optical integrator and the displacement of said second lens array unit by said actuator contributes to compensating for a change in said predetermined refracting power of said optical integrator due to the displacement of said first lens array unit.

8. A device according to claim 6, wherein said optical integrator further includes a third lens array unit having a plurality of lens elements disposed along a plane perpendicular to the optical axis, and wherein said third lens array unit receives light that has passed through said first and second lens array units to supply the light beams to said directing means.

9. An exposure apparatus for exposing a semiconductor wafer to a circuit pattern of a mask with light, said apparatus comprising:
    a light source;
    secondary light source forming means for forming predetermined secondary light sources by use of light from said light source, said secondary light source forming means including a plurality of lens array units disposed along an optical axis, each lens array unit having a plurality of lens elements disposed along a plane orthogonal to the optical axis;

an optical arrangement for directing light beams from said secondary light sources to the mask and for superposing the light beams upon one another on the mask; and means for changing the positional relationship of said lens array units, in the direction of the optical axis, while maintaining a substantially constant refracting power of said secondary light source forming means, to thereby adjust the illuminance distribution on the mask.

10. An exposure apparatus for exposing a semiconductor wafer to a circuit pattern of a mask with light, said apparatus comprising:

a light source for providing light of a predetermined wavelength;

an optical integrator having a predetermined refracting power and a predetermined spherical aberration with respect to said predetermined wavelength, for receiving the light from said light source and for providing a plurality of light beams;

means for directing the light beams from said optical integrator to the mask so that the light beams are superposed upon one another on the mask; and adjusting means for adjusting said predetermined spherical aberration of said optical integrator while substantially maintaining said predetermined refracting power of said optical integrator, to change the illuminance distribution on the mask to be illuminated.

11. A device according to claim 10, said optical integrator includes first and second moveable lens array units disposed along an optical axis, each unit including a plurality of lens elements disposed along a plane perpendicular to the optical axis, and wherein said adjusting means includes an actuator for displacing said first and second lens array units to change the illuminance distribution on the mask to be illuminated.

12. A device according to claim 11, wherein the displacement of said first lens array unit by said actuator contributes to adjustment of said predetermined spherical aberration of said optical integrator and the displacement of said second lens array unit by said actuator contributes to compensating for a change in said predetermined refracting power of said optical integrator due to the displacement of said first lens array unit.

13. A device according to claim 11, wherein said optical integrator further includes a third lens array unit having a plurality of lens elements disposed along a plane perpendicular to the optical, axis, and wherein said third lens array unit receives light that has passed through said first and second lens array units to supply the light beams to said directing means.

* * * * *